(12) United States Patent
Islam et al.

(10) Patent No.: US 11,095,353 B2
(45) Date of Patent: Aug. 17, 2021

(54) USE OF LOW RESOLUTION ANALOG-TO-DIGITAL CONVERTER/DIGITAL-TO-ANALOG CONVERTER

(71) Applicant: QUALCOMM Incorporated, San Diego, CA (US)

(72) Inventors: Muhammad Nazmul Islam, Littleton, MA (US); Juergen Cezanne, Ocean Township, NJ (US); Ashwin Sampath, Skillman, NJ (US); Joseph Patrick Burke, San Diego, CA (US); Dai Lu, San Diego, CA (US); Junyi Li, Chester, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 46 days.

(21) Appl. No.: 16/741,175

(22) Filed: Jan. 13, 2020

(65) Prior Publication Data
US 2020/0259543 A1 Aug. 13, 2020

Related U.S. Application Data

(60) Provisional application No. 62/804,122, filed on Feb. 11, 2019.

(51) Int. Cl.
*H04B 7/06* (2006.01)
*H03M 1/14* (2006.01)
*H04L 1/00* (2006.01)

(52) U.S. Cl.
CPC ............ *H04B 7/0632* (2013.01); *H03M 1/14* (2013.01); *H04L 1/0026* (2013.01)

(58) Field of Classification Search
CPC ....... H04B 7/0632; H03M 1/14; H04L 1/0026
See application file for complete search history.

(56) References Cited

U.S. PATENT DOCUMENTS

| | | | |
|---|---|---|---|
| 7,205,923 B1 * | 4/2007 | Bahai | .................... H03M 1/007 341/155 |
| 2005/0084037 A1 | 4/2005 | Liang | |
| 2005/0270217 A1 | 12/2005 | Chiang et al. | |
| 2007/0001889 A1 | 1/2007 | Garlapati et al. | |

(Continued)

OTHER PUBLICATIONS

International Search Report and Written Opinion—PCT/US2020/013519—ISA/EPO—dated May 19, 2020.

(Continued)

*Primary Examiner* — Freshteh N Aghdam
(74) *Attorney, Agent, or Firm* — Holland & Hart LLP

(57) ABSTRACT

Methods, systems, and devices for wireless communications are described. A wireless device, such as a base station and/or a user equipment (UE), may select a first resolution for a first analog-to-digital or digital-to-analog conversion process associated with a first wireless communication. The wireless device may determine that the first wireless communication is performed according to the first resolution. The wireless device may select, based at least in part on the determining, a second resolution for a second analog-to-digital or digital-to-analog conversion process associated with a second wireless communication, the first resolution being a lower resolution than the second resolution.

30 Claims, 11 Drawing Sheets

(56) References Cited

U.S. PATENT DOCUMENTS

| | | | |
|---|---|---|---|
| 2007/0052570 A1* | 3/2007 | Swerlein | H03M 3/322 |
| | | | 341/155 |
| 2009/0161798 A1 | 6/2009 | Wong et al. | |
| 2012/0127006 A1* | 5/2012 | Oo | H03M 1/124 |
| | | | 341/122 |
| 2012/0154193 A1* | 6/2012 | Chang | H03M 1/145 |
| | | | 341/156 |
| 2018/0110007 A1* | 4/2018 | Park | H04W 52/0232 |

OTHER PUBLICATIONS

Ku G, et al., "Resource Allocation and Link Adaptation in LTE and LTE Advanced: A Tutorial ", IEEE Communications Surveys & Tutorials, vol. 17, No. 3, 2015, pp. 1605-1633, XP055263979, New York, DOI: 10.1109/COMST.2014.2383691, Retrieved from the Internet: URL: https://ieeexplore.ieee.org/document/6990494 [retrieved on Apr. 8, 2016], Section VI, "Link Adaptation", figures 1,2,3,6,7,10; table VIII.

Nanda S, et al., "Adaptation Techniques in Wireless Packet Data Services," IEEE Communications Magazine, IEEE Service Center, Piscataway, US, vol. 38, No. 1, Jan. 1, 2000 (Jan. 1, 2000), pp. 54-64, XP011091213, ISSN 0163-6804, Section 'A Summary of Rate Adaptation' figures 2,3,5,8,9; table 1.

\* cited by examiner

USE OF LOW RESOLUTION ANALOG-TO-DIGITAL CONVERTER/DIGITAL-TO-ANALOG CONVERTER

CROSS REFERENCE

The present application for patent claims the benefit of U.S. Provisional Patent Application No. 62/804,122 by ISLAM et al., entitled "USE OF LOW RESOLUTION ANALOG-TO-DIGITAL CONVERTER/DIGITAL-TO-ANALOG CONVERTER," filed Feb. 11, 2019, assigned to the assignee hereof, and expressly incorporated herein.

BACKGROUND

The following relates generally to wireless communications, and more specifically to use of low resolution analog-to-digital converter/digital-to-analog converter (ADC/DAC).

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

Wireless devices communicating in a wireless network use various hardware components, functional processes, and the like, to support wireless communications. Each component/process being utilized by a wireless device generally consumes power. The amount and/or configuration of such components/processes may be based, at least in some aspects, on the configuration of the wireless network. For example, some networks (such as a legacy network) may be configured such that minimal components/processes are needed to support wireless communications, whereas other networks (such as advanced networks, e.g., NR or 5G networks) may need more components/processes to support wireless communications. Thus, advances in wireless networks may have a corresponding increase in power consumption by the wireless devices. While such advances may improve network performance overall, this may create difficulties in terms of power consumption (e.g., battery life) for the wireless devices.

SUMMARY

The described techniques relate to improved methods, systems, devices, and apparatuses that support use of low resolution analog-to-digital converter/digital-to-analog converter (ADC/DAC). Generally, the described techniques provide for utilization of a low resolution ADC/DAC process up until an event occurrence, and then switching to a higher resolution ADC/DAC process after the event occurs. A low resolution ADC/DAC process typically consumes less power than a high resolution ADC/DAC process. Generally, the event may refer to communicating one or more first signal(s), and then the wireless device switching to a high resolution ADC/DAC process to communicate one or more second signal(s). For example, wireless device may use or otherwise select the first resolution (e.g., a low resolution) for an ADC process (when receiving) and/or a DAC process (when transmitting) for a first wireless communication (e.g., an uplink and/or downlink wireless communication). Once the first wireless communication has been performed according to the first resolution (e.g., once the event occurs), the wireless device may then use or otherwise select the second resolution (e.g., the higher resolution) for an ADC process (when receiving) and/or a DAC process (when transmitting) for a second wireless communication (e.g., an uplink and/or downlink wireless communication). As one example, the event may be based on a transmission and/or reception of a first synchronization signal (e.g., a primary synchronization signal (PSS)) according to the first resolution, with an additional synchronization signal (e.g., secondary synchronization signal (SSS)) being communicated according to the second resolution. Another example of the event may include, but is not limited to, transmission and/or reception of a first random access signal (e.g., a random access channel (RACH) signal and/or message) according to the first resolution, with a second random access signal being communicated according to the second resolution. In other non-limiting examples, the event may be based on initial system information signals, paging signals, control channels signals, and the like. Accordingly, aspects of the described techniques can serve or otherwise minimize power consumption of the wireless device (whether transmitting or receiving) by utilizing low resolution for ADC/DAC processes until event occurrence (e.g., a first signal is communicated), and then switching to high resolution for ADC/DAC processes for subsequent events (e.g., for communicating subsequent signals).

A method of wireless communications at a wireless device is described. The method may include selecting a first resolution for a first analog-to-digital or digital-to-analog conversion process associated with a first wireless communication, determining that the first wireless communication is performed according to the first resolution, and selecting, based on the determining, a second resolution for a second analog-to-digital or digital-to-analog conversion process associated with a second wireless communication, the first resolution being a lower resolution than the second resolution.

An apparatus for wireless communications at a wireless device is described. The apparatus may include a processor, memory in electronic communication with the processor, and instructions stored in the memory. The instructions may be executable by the processor to cause the apparatus to select a first resolution for a first analog-to-digital or digital-to-analog conversion process associated with a first wireless communication, determine that the first wireless communication is performed according to the first resolution, and select, based on the determining, a second resolution for a second analog-to-digital or digital-to-analog conversion process associated with a second wireless communication, the first resolution being a lower resolution than the second resolution.

Another apparatus for wireless communications at a wireless device is described. The apparatus may include means for selecting a first resolution for a first analog-to-digital or digital-to-analog conversion process associated with a first wireless communication, determining that the first wireless communication is performed according to the first resolution, and selecting, based on the determining, a second resolution for a second analog-to-digital or digital-to-analog conversion process associated with a second wireless communication, the first resolution being a lower resolution than the second resolution.

A non-transitory computer-readable medium storing code for wireless communications at a wireless device is described. The code may include instructions executable by a processor to select a first resolution for a first analog-to-digital or digital-to-analog conversion process associated with a first wireless communication, determine that the first wireless communication is performed according to the first resolution, and select, based on the determining, a second resolution for a second analog-to-digital or digital-to-analog conversion process associated with a second wireless communication, the first resolution being a lower resolution than the second resolution.

Some examples of the method, apparatuses, and non-transitory computer-readable medium described herein may further include operations, features, means, or instructions for selecting a first number of bits per sample for the first analog-to-digital or digital-to-analog conversion process and a second number of bits per sample for the second analog-to-digital or digital-to-analog conversion process, the second number of bits being greater than the first number of bits.

Some examples of the method, apparatuses, and non-transitory computer-readable medium described herein may further include operations, features, means, or instructions for selecting a first number of conversion stages for the first analog-to-digital or digital-to-analog conversion process and a second number of conversion stages for the second analog-to-digital or digital-to-analog conversion process, the second number of conversion stages being greater than the first number of conversion stages.

Some examples of the method, apparatuses, and non-transitory computer-readable medium described herein may further include operations, features, means, or instructions for selecting a first sampling rate for the first analog-to-digital or digital-to-analog conversion process and a second sampling rate for the second analog-to-digital or digital-to-analog conversion process, the second sampling rate being greater than the first sampling rate.

Some examples of the method, apparatuses, and non-transitory computer-readable medium described herein may further include operations, features, means, or instructions for determining that a channel quality may have crossed a threshold, where the first resolution may be selected for the first analog-to-digital or digital-to-analog conversion process based on the channel quality crossing the threshold.

Some examples of the method, apparatuses, and non-transitory computer-readable medium described herein may further include operations, features, means, or instructions for transmitting, based on the channel quality crossing the threshold, a signal indicating that the first wireless communication may be performed according to the first resolution.

In some examples of the method, apparatuses, and non-transitory computer-readable medium described herein, the signal includes at least one of a system information signal, a medium access control (MAC) control element (CE) signal, a radio resource control (RRC) signal, a downlink control information (DCI) signal, a handover command signal, or a combination thereof.

In some examples of the method, apparatuses, and non-transitory computer-readable medium described herein, the channel quality includes at least one of a signal-to-noise ratio (SNR), a signal-to-interference-to-noise ratio (SINR), a reference signal received power (RSRP), a reference signal received quality (RSRQ), or a combination thereof.

Some examples of the method, apparatuses, and non-transitory computer-readable medium described herein may further include operations, features, means, or instructions for receiving a signal indicating that the first wireless communication may be performed according to the first resolution.

Some examples of the method, apparatuses, and non-transitory computer-readable medium described herein may further include operations, features, means, or instructions for receiving the first wireless communication, performing a first analog-to-digital conversion process on the first wireless communication using the first resolution, receiving the second wireless communication, and performing a second analog-to-digital conversion process on the second wireless communication using the second resolution.

Some examples of the method, apparatuses, and non-transitory computer-readable medium described herein may further include operations, features, means, or instructions for performing a first digital-to-analog conversion process on the first wireless communication using the first resolution, transmitting the first wireless communication, performing a second digital-to-analog conversion process on the second wireless communication using the second resolution, and transmitting the second wireless communication.

In some examples of the method, apparatuses, and non-transitory computer-readable medium described herein, the first wireless communication includes at least one of a PSS, a SSS, a physical broadcast channel (PBCH) signal, a system information signal, a RACH signal, a RACH message, a paging signal, a control channel signal, a data channel signal, a wake up signal, a channel state interference reference signal (CSI-RS), a tracking reference signal (TRS), or a combination thereof.

In some examples of the method, apparatuses, and non-transitory computer-readable medium described herein, the RACH message includes at least one of a random access response (RAR) message, a first uplink message following the RAR message, a contention resolution message, or a combination thereof.

In some examples of the method, apparatuses, and non-transitory computer-readable medium described herein, the second wireless communication includes at least one of a SSS, a PBCH signal, a system information signal, a RACH signal, a RACH message, a paging signal, a control channel signal, a data channel signal, or a combination thereof.

In some examples of the method, apparatuses, and non-transitory computer-readable medium described herein, the RACH message includes at least one of a RAR message, a first uplink message following the RAR message, a contention resolution message, or a combination thereof.

In some examples of the method, apparatuses, and non-transitory computer-readable medium described herein, the wireless device includes at least one of a base station or a UE.

DETAILED DESCRIPTION

Figure 1:
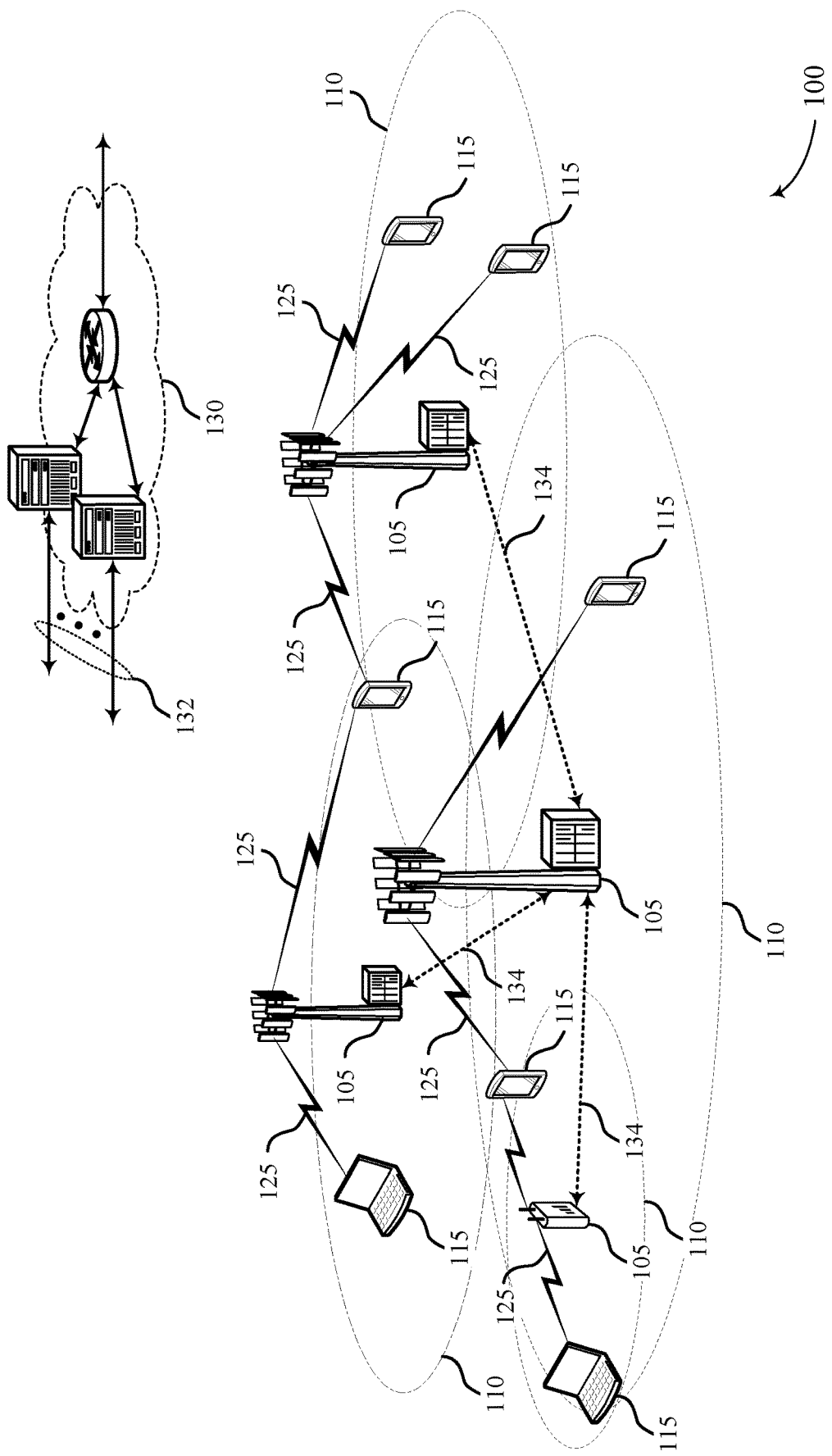
FIG. 1 illustrates an example of a system for wireless communications that supports use of low resolution analog-to-digital converter/digital-to-analog converter (ADC/DAC) in accordance with aspects of the present disclosure.

Wireless communication systems may be configured differently, such that some wireless networks may be more complicated or otherwise complex than other wireless networks. Examples include, but are not limited to, millimeter wave (mmW) networks, New Radio (NR) networks, fifth generation (5G) networks, or any network supporting higher bandwidth/throughput, any network supporting a high number of antennas (e.g., to support directional transmissions/receptions), and the like. As networks continue to advance, this may have a corresponding increase in the complexity of hardware and/or processes utilized during wireless communications. Each hardware, process, and the like, may have a corresponding power consumption cost for the wireless device operating on the network.

As one non-limiting example, a receiving wireless device may consume a large amount of power trying to detect synchronization signals, reference signals, tracking signals, and the like, in a wireless network utilizing a higher bandwidth and/or in a directional manner. Similarly, the transmitting wireless device may consume a large amount of power transmitting such signals over a higher bandwidth and/or in a directional manner. Such wireless devices consume power in an advanced wireless network by activating or otherwise implementing more advanced (or simply more) hardware components, functional processes, and the like, to support wireless communications over the network.

In some networks, such as a mmW network with relatively small coverage areas and directional transmissions/receptions, such power consumption may be excessive and sometimes unnecessary. For example, base station deployment in a mmW network may be gradual, which may create the situation where a mmW-configured user equipment (UE) could waste power attempting to detect mmW signals in an area where no mmW base stations have been deployed. Similarly, a mmW-configured base station may waste power transmitting mmW signals when there are no mmW-configured UE(s) within its coverage area. That is, the hardware components, functional processes, and the like, utilized in performing and/or attempting to detect transmissions consumes power at the wireless device. Accordingly, aspects of the described techniques provide various mechanisms to reduce or otherwise improve power consumption of a wireless device, such as when the wireless device is operating in an advanced wireless network.

A wireless device may include a UE and/or a base station (both during transmission and/or reception) that implements low resolution analog-to-digital converter/digital-to-analog converter (ADC/DAC) processes for a first wireless communication (e.g., until an event occurs or is otherwise detected) in order to conserve or otherwise minimize power consumption at the wireless device. For example, the wireless device may use or otherwise select the first resolution (e.g., a low resolution) for use in an ADC process (when receiving) and/or in a DAC process (when transmitting) for a first wireless communication. Generally, occurrence or performance of the first wireless communications according to the first resolution may be the trigger or event that signals the wireless device to use or otherwise select the second resolution (e.g., a high resolution) for a second or subsequent DAC process (when transmitting) and/or ADC process (when receiving) for a second wireless communication. Accordingly, utilizing a low resolution ADC/DAC process until the first wireless communication is performed may conserve or otherwise minimize power consumption at the wireless device.

Aspects of the disclosure are initially described in the context of a wireless communications system. Aspects of the disclosure are further illustrated by and described with reference to apparatus diagrams, system diagrams, and flowcharts that relate to use of low resolution ADC/DAC.

FIG. 1 illustrates an example of a wireless communications system 100 that supports use of low resolution ADC/DAC in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a NR network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

As discussed herein, wireless communications system 100 may, in some cases, refer to a mmW system supporting mmW communications between UEs 115 and base stations 105. To achieve high data rates and meet link budget, mmW systems may utilize high bandwidth and an increased number of antennas for communications (e.g., compared to sub-6 GHz communications systems). Receiver hardware and antenna array (e.g., or antenna sub-array) circuitry for receiving such communications may be associated with high power consumption. For example, powering of device circuitry for high resolution ADC/DAC for reception and transmission of such mmW communications, in addition to powering of a large number of antenna elements for reception and transmission of such mmW communications, may lead to high battery power drainage rates in mmW technology UEs 115.

As such, according to the techniques described herein, wireless devices of wireless communication system 100 (e.g., base stations 105 and/or UE 115, whether transmitting or receiving) may select the first resolution for a first ADC/DAC process associated with the first wireless communication. The wireless devices may determine that the first wireless communication has been performed according to the first resolution and select a second resolution for a second ADC/DAC process associated with the second wireless communication. In some aspects, the first resolution may be lower than the second resolution, e.g., the first resolution may be a lower resolution with respect to the second resolution.

Figure 2:
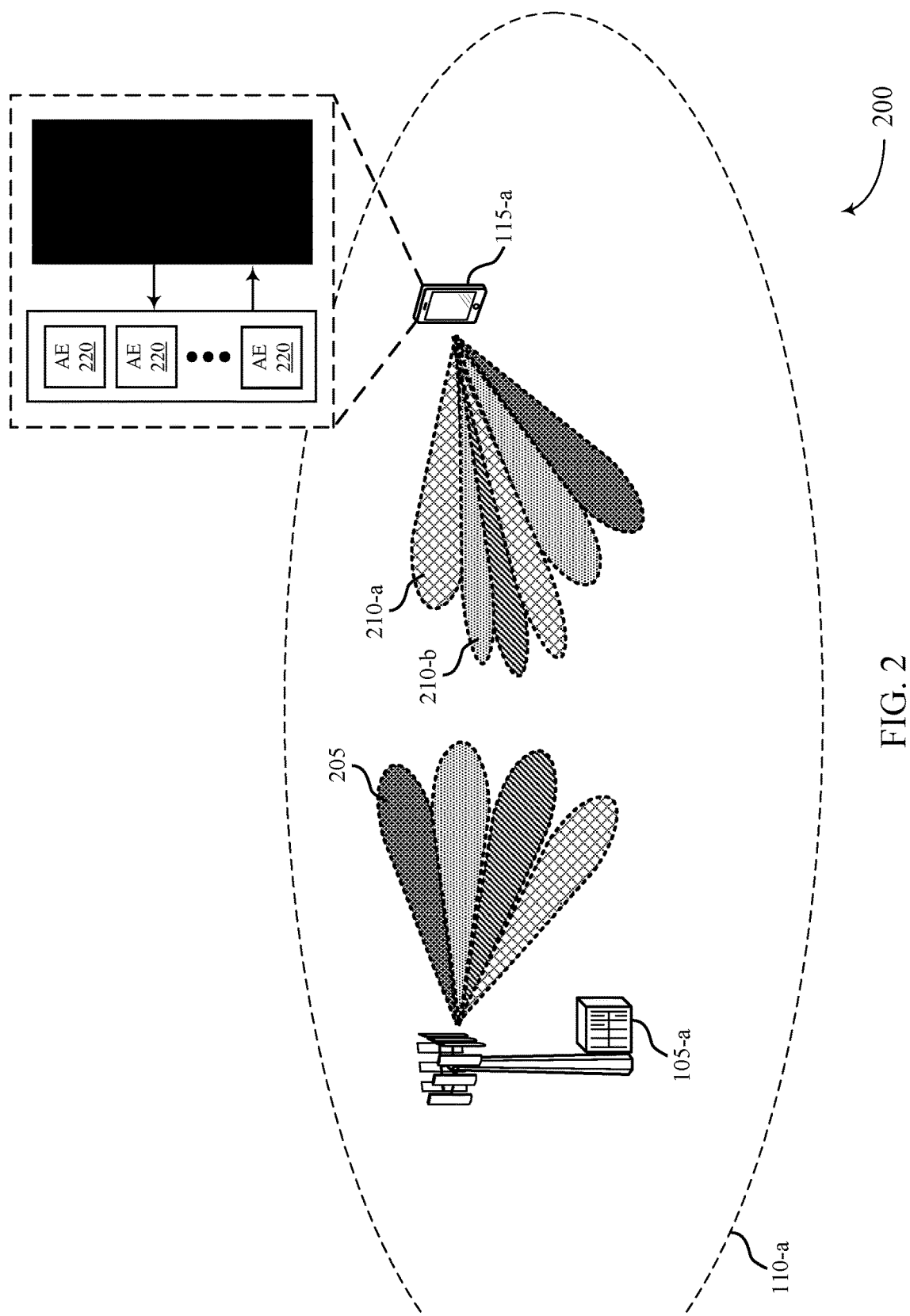
FIG. 2 illustrates an example of a wireless communications system that supports use of low resolution ADC/DAC in accordance with aspects of the present disclosure.

FIG. 2 illustrates an example of a wireless communications system 200 that supports use of low resolution ADC/DAC in accordance with aspects of the present disclosure. In some examples, wireless communications system 200 may implement aspects of wireless communications system 100. For example, wireless communications system 200 may include a base station 105-a, a UE 115-a, and a geographic coverage area 110-a, which may be an example of aspects of a base station 105, a UE 115, and a geographic coverage area 110 as described with reference to FIG. 1.

Broadly, wireless communications system 200 may be configured to support the use of low resolution ADC/DAC by wireless devices, such as base station 105-a and/or UE 115-a. For example, the wireless devices may utilize the described techniques during a transmission and/or during a reception. In some aspects, the described techniques may be utilized by one wireless device, but not by the other wireless device (e.g., a transmitting wireless device could transmit a signal using a high resolution during its DAC process, and a receiving wireless device receiving the signal using a lower resolution during its ADC process, or vice versa).

In some aspects, the described techniques may support the wireless devices utilizing a low resolution until the occurrence or detection of an event. For example, the wireless device may utilize or otherwise select the first resolution (e.g., the low resolution) to use during an ADC/DAC process associated with the first wireless communication. The wireless device may detect or otherwise determine that the first wireless communication has been performed according to the first resolution (e.g., the low resolution), and then use a second resolution (e.g., high resolution) for a second wireless communication. Accordingly, the wireless device may conserve power communicating over wireless communication system 200 until the occurrence or performance of the event is determined.

Generally, the described techniques provide for the utilization of different resolution levels in ADC and/or DAC conversion processes by a wireless device (e.g., UE 115-a or base station 105-a) in the wireless communications system 200. In some cases, wireless communications system 200 may refer to, for example, an advanced wireless network, such as a NR network, a 5G network, a mmW system, and the like. In the example of FIG. 2, a UE 115-a may include a modem 215 in connection (e.g., through various circuitry, digital signal processing components, etc.) with some number of antenna elements (AEs) 220 for beamforming communications. For example, UE 115-a may support beamforming techniques for wireless communications, which may allow the UE 115-a to transmit and/or receive communications over one or more beams 210. The beamforming techniques may utilize one or more antenna arrays included in the UE 115-a. In some cases, at least one antenna array may be used to transmit communications (e.g., via any or some of beams 210) and at least one other antenna array may be used to receive communications (e.g., via any or some of beams 210). In some cases, one or more antenna arrays may be used to transmit and receive communications (e.g., via any or some of beams 210), and some transmit/receive circuitry switch may be associated with the one or more antenna arrays to switch between receiving and transmitting.

For example, UE 115-a may generate data (e.g., digital information) for transmission via the modem 215, may pass the digital information signal through a DAC 225, and may use some configuration of antenna elements 220 (e.g., some antenna configuration) for transmission of the analog signal over one or more beams 210. Further, UE 115-a may receive a waveform via some configuration of antenna elements 220 (e.g., some antenna configuration), may pass the analog information signal through an ADC 230, and may decode the data (e.g., the converted digital information) via the modem 215.

A DAC 225 may convert a digital signal (e.g., a digital data stream) into an analog signal (e.g., which may be transmitted according to some antenna configuration). ADC 230 may convert an analog signal (e.g., which may be received according to some antenna configuration) into a digital signal (e.g., a digital data stream that may be decoded). As such, an ADC process may be modeled as two processes, sampling and quantization. Sampling converts a time-varying voltage signal into a discrete-time signal, a sequence of real numbers. Quantization replaces each real number with an approximation from a finite set of discrete values. Several ADC/DAC architectures may be implemented. The suitability of an ADC/DAC for a particular application may be determined by figures of merit including resolution, maximum sampling frequency (rate), etc. In some cases ADC/DAC may degrade a signal. As such, ADC/DAC architectures and implementation may be selected such that introduced errors from ADC/DAC processes are insignificant (e.g., or non-detrimental) in terms of the application.

For example, quantization error may refer to the difference between the analog signal and the closest available digital value at each sampling instant from the ADC. Quantization error may thus introduce noise, called quantization noise, to the sample signal. Quantization noise may refer to a rounding error between the analog input voltage to the ADC and the output digitized value. In some cases, the noise may thus be non-linear and signal-dependent. In some cases, a relationship exists between ADC/DAC resolution (e.g., in bits) and quantization error (e.g., quantization noise expressed in some dB). The higher the resolution of the ADC/DAC, the lower the quantization error and the smaller the quantization noise. That is, higher resolution ADC/DAC (e.g., ADC/DAC with more significant bits, higher sampling rate, more sampling stages, etc.) may provide for reduced quantization error.

In some cases, a UE 115-a may employ ADC/DAC (e.g., via ADC 230 and DAC 225) with variable resolution. For example, in some cases, a UE 115-a may power (e.g., or conversely turn-off) some stages or portions of ADC/DAC circuitry, where each stage may focus on different significant bits (e.g., from a most significant bit (MSB) to a least significant bit (LSB)). As such, UE 115-a may be capable of increasing resolution for ADC/DAC by powering additional ADC/DAC circuitry, or conversely may be capable of decreasing resolution for ADC/DAC by turning-off some stages or portions of ADC/DAC circuitry (e.g., as some stages or portions of ADC/DAC circuitry may be responsible for certain bits of the conversion).

Additionally or alternatively, in some cases, UE 115-a may vary the sampling rate of the ADC/DAC, which may further effect the resolution of ADC/DAC. Generally, sampling rate may refer to the speed at which ADC 230 samples an analog input (e.g., as received from one or more AE(s) 220) during receive operation. On the transmit side, the sampling rate may refer to the speed at which DAC 225 sends out an analog output based on a digital input signal. A higher sampling rate may produce higher resolution than a lower sampling rate, but at the cost of additional processing and power consumption. Conversely, a lower sampling rate may have a corresponding reduced cost factor in terms of processing and power consumption, but may have a lower resolution.

Additionally or alternatively, in some cases, UE 115-a may adjust the number of bits per sample utilized in an ADC/DAC conversion process. For example, the output from ADC 230 may generally include a set of bits (e.g., 8 bits, 12 bits, 24 bits, etc.), with more bits providing a higher resolution (at a higher power consumption cost) for the output. Similarly, the output from DAC 225 may have lower resolution when less bits per sample are utilized to generate the analog signal.

Powering of more stages (also called conversion stages) or portions of ADC/DAC circuitry, changing the number of bits per sample, as well as powering of higher sampling rates, may thus result in higher resolution ADC/DAC, at the cost of increased power consumption.

The components of UE 115-a are shown for exemplary purposes only. The techniques described herein may be applied to various circuitry, hardware configurations, digital signal process (DSP) techniques, etc. for mmW communications by analogy, without departing from the scope of the present disclosure. For example, in some cases, DAC 225 and ADC 230 may be separately located from the modem 215, the UE 115-a may include other radio frequency (RF) circuitry/intermediate frequency (IF) circuitry/baseband circuitry, etc., the UE 115-a may include other mixers, splitters, combiners, amplifiers, phase shifters, etc.

Moreover, base station 105-a may also include ADC/DAC circuitry, a variety of antenna configurations or arrays, modems, and the like. Accordingly, the described techniques are generally implemented by a wireless device, which may be UE 115-a and/or base station 105-a. That is, the described techniques are equally applicable to any wireless device that is transmitting and/or receiving wireless communications within wireless communications system 200. For example, base station 105-a may implement aspects of the described techniques when transmitting a signal to UE 115-a (or to another base station), with UE 115-a utilizing the described techniques when receiving a signal from base station 105-a. As another example, UE 115-a may implement aspects of the described techniques when transmitting a signal to base station 105-a (or to another UE), with base station 105-a utilizing the described techniques when receiving the signal from UE 115-a. In the example where wireless communication system 200 is a mmW network, base station 105-a may utilize the described techniques when communicating signals to UE 115-a over one or more of beams 205.

As discussed herein, aspects of the described techniques may be event driven. Broadly, the event may be considered to have occurred or performed when a first wireless communication is performed according to the first resolution (e.g., the low resolution selected for an ADC/DAC process). Broadly, the first wireless communication may refer to transmitting an uplink transmission, transmitting a downlink transmission, reception of an uplink transmission, reception of a downlink transmission, and the like. In some aspects, the first wireless communication may refer to a particular type of signal.

As one example, the first wireless communication may refer to a synchronization signal. For example, the wireless device (e.g., base station 105-a and/or UE 115-a) may use the low resolution (e.g., the first resolution) for transmission and/or reception of a primary synchronization signal (PSS) (and/or a physical broadcast channel (PBCH) signal). Once the wireless device determines that the PSS has been performed (e.g., has been transmitted and/or received), a wireless device may select the second resolution for a second ADC/DAC process for a second wireless communication. In this example, the second wireless communication may refer to other synchronization signals, e.g., a secondary synchronization signal (SSS). That is, UE 115-a (or base station 105-a) may use a low resolution ADC until PSS detection has occurred, and then select or otherwise use higher resolution ADC to detect SSS/PBCH. UE 115-a may continue to use the high resolution (e.g., the second resolution) ADC/DAC to receive (or transmit) subsequent signals.

As another example, the first wireless communication may refer to both PSS and SSS. For example, UE 115-a (or base station 105-a) may receive (or transmit) PSS and SSS according to the first resolution (e.g., the low resolution) according to ADC/DAC processes, and then select the second resolution (e.g., a high resolution) for ADC/DAC processes according to subsequent communications.

In another example, the first wireless communication may refer to some or all of PSS, SSS, and/or a PBCH signal. For example, UE 115-a (or base station 105-a) may receive (or transmit) PSS, SSS, and PBCH according to the first resolution (e.g., the low resolution) according to ADC/DAC processes, and then switch to the second resolution (e.g., the high resolution) for ADC/DAC processes according to subsequent communications.

In another example, the first wireless communication may refer to system information and/or random access channel (RACH) communications. For example, the first wireless communication may be performed according to the first resolution for a remaining minimum system information (RMSI), a RACH message one (Msg1), a RACH message two (Msg2), a RACH message three (Msg3), and/or a RACH message four (Msg4). In one example, this may include utilizing the low resolution for ADC/DAC processes during RMSI detection, Msg1 transmission, Msg2 detection, Msg3 transmission, and Msg4 detection. That is, in one example UE 115-a may use low resolution ADC/DAC processes to receive an SSB, Msg2, and Msg4, with base station 105-a using low resolution ADC/DAC processes to transmit Msg1 and Msg3, or vice versa. UE 115-a (or base station 105-a) may then switch to the second resolution (e.g., the higher resolution) for ADC/DAC processes for subsequent communications after that.

In another example, the first wireless communication may refer to the paging signal. For example, UE 115-a (or base station 105-a) may utilize low resolution for ADC/DAC processes when communicating a paging signal (or message). In some aspects, the paging signal (or message) may refer to a PDCCH signal, the PDSCH signal, a PUCCH signal, a PUSCH signal, and the like.

In another example, the first wireless communication may refer to RACH communications. For example, base station 105-a (or UE 115-a) may use low resolution DAC to transmit SSB and RMSI, and also use low resolution ADC to receive one or more RACH signals or messages. Base station 105-a (or UE 115-a) may use higher resolution ADC/DAC processes to communicate after that. In some scenarios, base station 105-a may not transmit PSS, but may still receive a RACH signal from UE 115-a. In this situation, base station 105-a may use low resolution ADC to receive a RACH signal, and, after detecting RACH, may transmit using high resolution DAC. Similarly, base station 105-a may use low resolution for ADC to receive RACH signals from UE 115-a.

In another example, the first wireless communication may refer to a combination of signals being communicated, such as PSS, SSS, PBCH, and/or RMSI. For example, base station 105-a (or UE 115-a) may communicate these signals using low resolution ADC/DAC processes, and then communicate other signals using high resolution ADC/DAC processes.

The low resolution for ADC/DAC may, for example, be configured or selected for idle mode operation where the UE 115-a may operate at low SNR. For example, the impact of quantization error (e.g., which may result from using lower resolution ADC/DAC) may be more prominent in higher SNR regimes. As such, scenarios (e.g., traffic conditions, quality of service (QoS) requirements, procedures, etc.) employing low modulation and coding schemes (MCSs) for low SNR channels may use lower resolution ADC/DAC power consumption to reduce power consumption without significant impact on communication efficiency in such scenarios.

The low resolution for ADC/DAC may, for example, be configured or selected based on the channel quality crossing a threshold. For example, UE 115-a (or base station 105-a) may determine that the channel quality (e.g., SNR, SINR, RSRP, RSRQ, etc.) has crossed a threshold and, based on this determination, select or otherwise use the first resolution (e.g., the low resolution). In one example, this may include a lower bit resolution being utilized in a slightly higher SNR, RSRP, etc., with a higher bit resolution being utilized with a lower SNR, RSRP, etc. In another example, this may include a higher bit resolution being utilized in a slightly lower SNR, RSRP, etc., with a lower bit resolution being utilized with a higher SNR, RSRP, etc. In some aspects, the wireless device determining that the channel quality has crossed a threshold (e.g. base station 105-a and/or a UE 115-a) may transmit or otherwise provide a signal (e.g., a MAC control element (CE), an RRC signal, a downlink control information (DCI), handover command signal, and the like) that carries or otherwise conveys an indication that the channel quality has crossed a threshold and/or that the first resolution has been selected for use in ADC/DAC processes for the first wireless communications.

In some examples, the high resolution ADC/DAC processes may implement different receiver algorithms in a baseband modem, where more sophisticated (e.g., with increased hardware, circuitry, powering, etc.) detection algorithms may be implemented. The low resolution during ADC/DAC processes may implement a limited set of receiver algorithms in RF/IF chips where relatively simplified algorithms may be implemented (e.g., with reduced hardware, circuitry, powering, etc. from turned-off portions of modem circuitry).

In some examples, base station 105-a may be configured to inform (e.g., via one or more signals) UE 115-a that it has the flexibility to support low power (or low resolution) ADC/DAC processes until the occurrence of the event (e.g., until a first wireless communication is performed according to the first resolution). Accordingly, low resolution ADC/DAC may reduce link budget (e.g., by at least a few decibels). In some aspects, the wireless device may determine that the inter-site distance is small, and therefore the loss of a few dBs may not impact performance until the event occurs beyond an acceptable threshold level. In some aspects, UE 115-a may also be configured to inform base station 105-a that it supports low power (or low resolution) ADC/DAC processes. In some aspects, base station 105-a and/or UE 115-a may utilize various signaling to convey such indications, e.g., RMSI, OSI, MAC CE, RRC signaling, DCI, handover commands, and the like.

Figure 3:
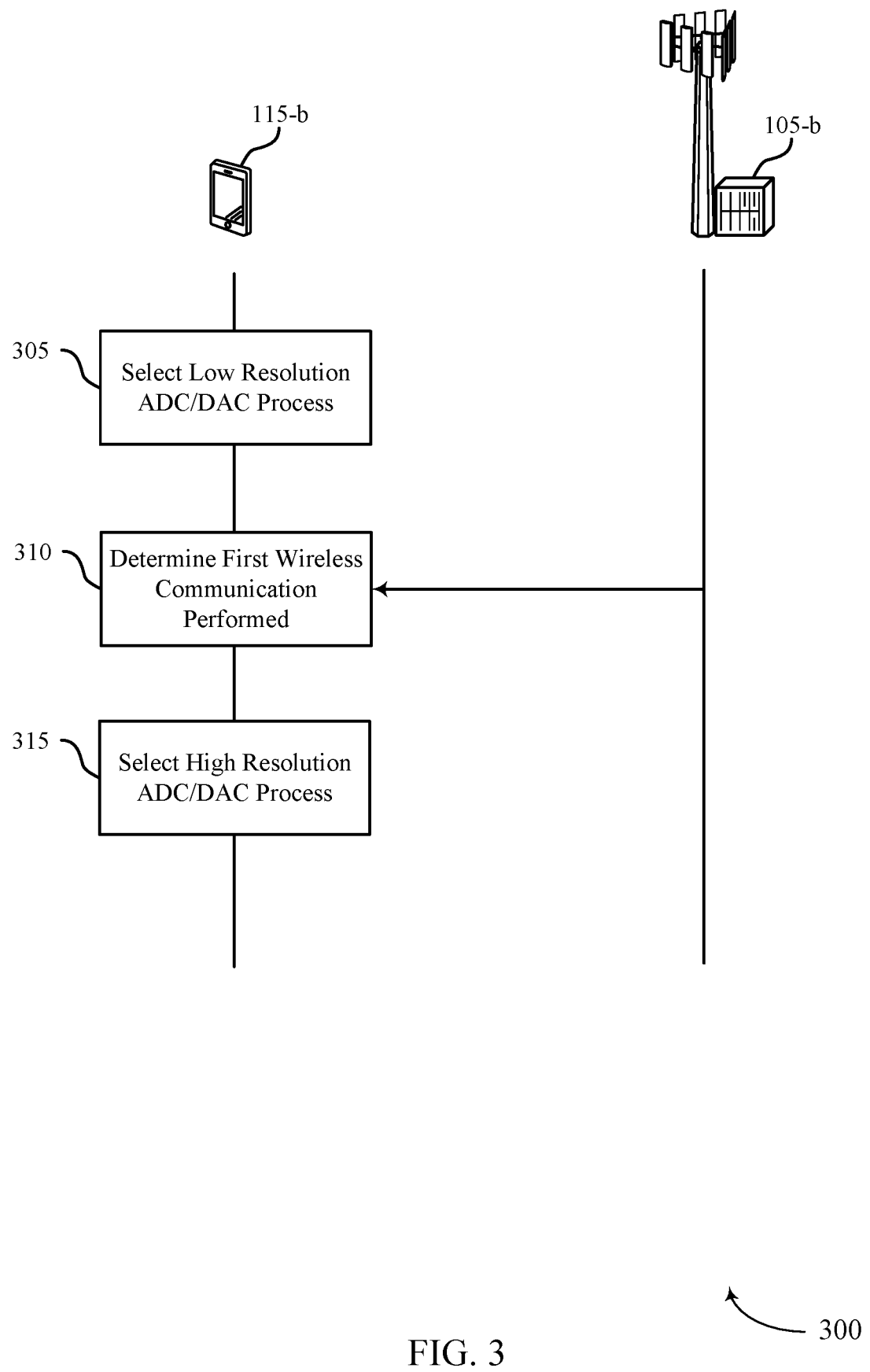
FIG. 3 illustrates an example of a process flow that supports use of low resolution ADC/DAC in accordance with aspects of the present disclosure.

FIG. 3 illustrates an example of a process flow 300 that supports use of low resolution ADC/DAC in accordance with aspects of the present disclosure. In some examples, process flow 300 may implement aspects of wireless communications system 100 and/or wireless communications system 200. Process flow 300 illustrates aspects of techniques performed by base station 105-b and UE 115-b, which may be examples of a base station 105 and UE 115 described with reference to FIGS. 1 and 2. In the following description of the process flow 300, the operations between the base station 105-b and UE 115-b may be transmitted in a different order than the exemplary order shown, or the operations performed by base station 105-b and UE 115-b may be performed in different orders or at different times. In some cases, certain operations may also be left out of the process flow 300, or other operations may be added to the process flow 300.

Generally, process flow 300 is described with reference to functions performed by a UE 115-b. However, it is to be understood that one or more of the functions described herein may also be performed or otherwise implemented by a base station 105-b. That is, the features described with reference to process flow 300 may be implemented by any wireless device, whether such wireless device is transmitting and/or receiving wireless communications.

At 305, UE 115-b may select a first resolution (e.g., low resolution) for a first ADC/DAC conversion process associated with a first wireless communication. In some aspects, this may include determining that a channel quality (e.g., CQI, SNR, SINR, etc.) has crossed a threshold. Based on the channel quality crossing the threshold, the first resolution may be selected for the first ADC/DAC conversion process. Based on the channel quality crossing the threshold, UE 115-b may transmit a signal indicating that the first wireless communication is performed according to the first resolution. Some examples of the signal used to indicate the channel quality crossing the threshold may include, but are not limited to, a MAC CE, an RRC signal, a DCI, handover command, and the like.

At 310, UE 115-b may determine that the first wireless communication has been performed according to the first resolution. In some aspects, this may include receiving the first wireless communication. In some aspects, this may include performing the first ADC/DAC conversion process on the first wireless communication using the first resolution and then transmitting the first wireless communication.

In some aspects, the first wireless communication may include, but is not limited to, a PSS, and SSS, a PBCH signal, a system information signal, a RACH signal, a RACH message, a paging signal, a control channel signal, a data channel signal, a wakeup signal, a CSI RS, a tracking reference signal (TRS), and the like. Examples of the RACH message include, but are not limited to, a random access response (RAR) message, a first uplink message following the RAR message, a contention resolution message, and the like.

At 315, UE 115-b may select, based at least in part on the determination that the first wireless communication has been performed according to the first resolution, a second resolution (e.g. a high resolution) for a second ADC/DAC conversion process associated with a second wireless communication. In some aspects, the first resolution may be a lower resolution than the second resolution.

In some aspects, this may include selecting a first number of bits per sample for the first ADC/DAC conversion process and a second number of bits per sample for the second ADC/DAC process. In some aspects, the second number of bits may be greater (e.g., may have more bits) than the first number of bits.

In some aspects, this may include selecting a first number of conversion stages for the first ADC/DAC conversion process and a second number of conversion stages for the second ADC/DAC conversion process. In some aspects, the second number of conversion stages may be greater than (e.g., may have more conversion stages) than the first number of conversion stages.

In some aspects, this may include selecting a first sampling rate for the first ADC/DAC conversion process and selecting a second sampling rate for the second ADC/DAC conversion process. In some aspects, the second sampling rate may be greater than (e.g., may be a higher sampling rate) the first sampling rate.

In some aspects, this may include receiving the second wireless communication and performing the second ADC/DAC conversion process on the second wireless communication using the second resolution. In some aspects, this may include performing the second ADC/DAC conversion process on the second wireless communication using the second resolution, and then transmitting the second wireless communications. In some aspects, this may include receiving the second wireless communication according to the second resolution.

In some aspects, the second wireless communication may include, but is not limited to, an SSS, a PBCH signal, a system information signal, a RACH signal, a RACH message, a paging signal, a control channel signal, a data channel signal, a wakeup signal, a CSI RS, a TRS, and the like. Examples of the RACH message include, but are not limited to, a RAR message, a first uplink message following the RAR message, a contention resolution message, and the like.

Figure 4:
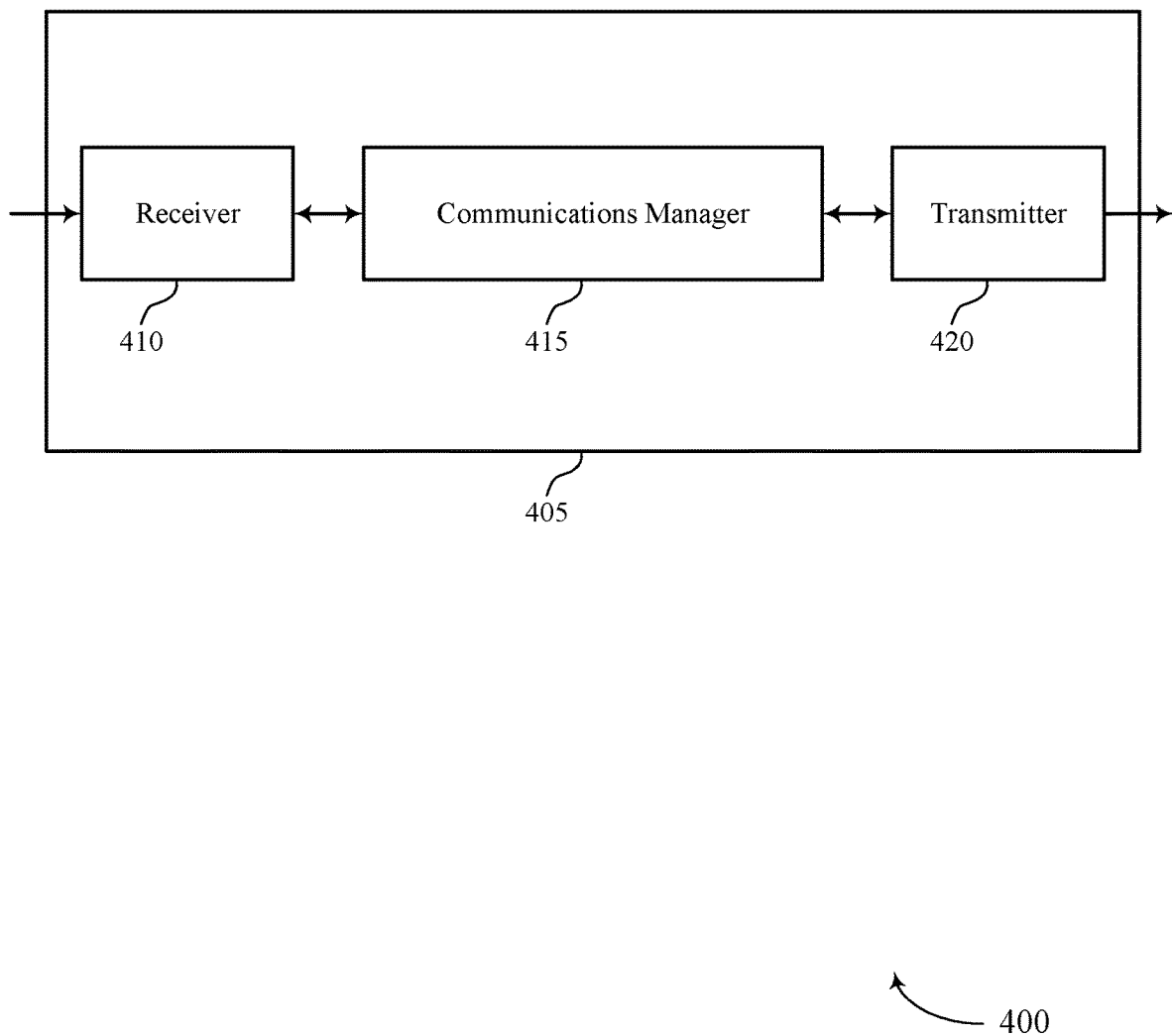
FIGS. 4 and 5 show block diagrams of devices that support use of low resolution ADC/DAC in accordance with aspects of the present disclosure.

FIG. 4 shows a block diagram 400 of a device 405 that supports use of low resolution ADC/DAC in accordance with aspects of the present disclosure. The device 405 may be an example of aspects of a UE 115 or base station 105 as described herein. The device 405 may include a receiver 410, a communications manager 415, and a transmitter 420. The device 405 may also include a processor. Each of these components may be in communication with one another (e.g., via one or more buses).

Receiver 410 may receive information such as packets, user data, or control information associated with various information channels (e.g., control channels, data channels, and information related to use of low resolution ADC/DAC, etc.). Information may be passed on to other components of the device 405. The receiver 410 may be an example of aspects of the transceiver 720 or 820 as described with reference to FIGS. 7 and 8. The receiver 410 may utilize a single antenna or a set of antennas.

The communications manager 415 may select a first resolution for a first analog-to-digital or digital-to-analog conversion process associated with a first wireless communication, determine that the first wireless communication is performed according to the first resolution, and select, based on the determining, a second resolution for a second analog-to-digital or digital-to-analog conversion process associated with a second wireless communication, the first resolution being a lower resolution than the second resolution. The communications manager 415 may be an example of aspects of the communications manager 710 or 810 as described herein.

The communications manager 415, or its sub-components, may be implemented in hardware, code (e.g., software or firmware) executed by a processor, or any combination thereof. If implemented in code executed by a processor, the functions of the communications manager 415, or its sub-components may be executed by a general-purpose processor, a DSP, an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 415, or its sub-components, may be physically located at various positions, including being distributed such that portions of functions are implemented at different physical locations by one or more physical components. In some examples, the communications manager 415, or its sub-components, may be a separate and distinct component in accordance with various aspects of the present disclosure. In some examples, the communications manager 415, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

Transmitter 420 may transmit signals generated by other components of the device 405. In some examples, the transmitter 420 may be collocated with a receiver 410 in a transceiver module. For example, the transmitter 420 may be an example of aspects of the transceiver 720 or 820 as described with reference to FIGS. 7 and 8. The transmitter 420 may utilize a single antenna or a set of antennas.

Figure 5:
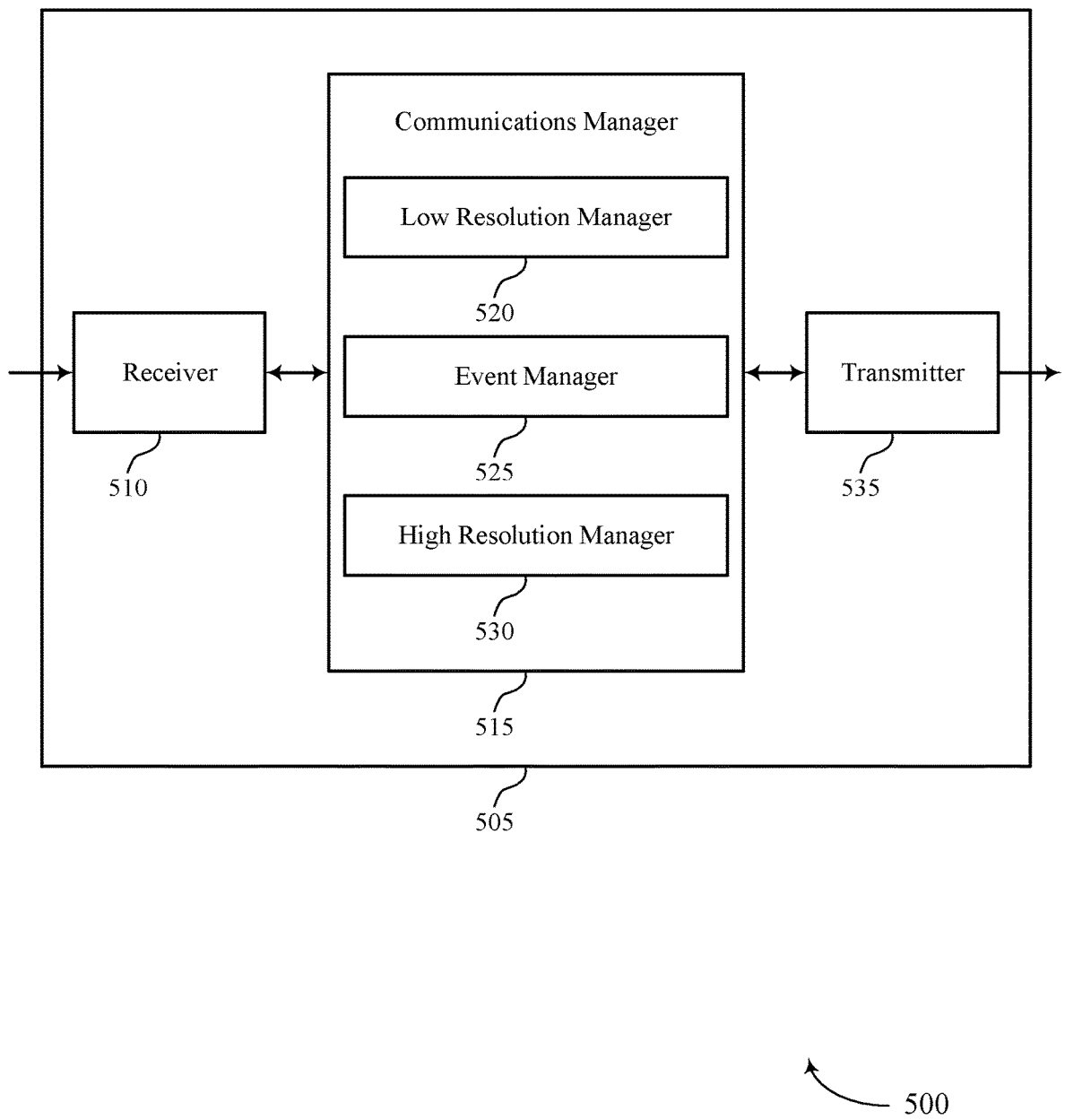

FIG. 5 shows a block diagram 500 of a device 505 that supports use of low resolution ADC/DAC in accordance with aspects of the present disclosure. The device 505 may be an example of aspects of a device 405, a UE 115, or a base station 105 as described herein. The device 505 may include a receiver 510, a communications manager 515, and a transmitter 535. The device 505 may also include a processor. Each of these components may be in communication with one another (e.g., via one or more buses).

Receiver 510 may receive information such as packets, user data, or control information associated with various information channels (e.g., control channels, data channels, and information related to use of low resolution ADC/DAC, etc.). Information may be passed on to other components of the device 505. The receiver 510 may be an example of aspects of the transceiver 720 or 820 as described with reference to FIGS. 7 and 8. The receiver 510 may utilize a single antenna or a set of antennas.

The communications manager 515 may be an example of aspects of the communications manager 415 as described herein. The communications manager 515 may include a low resolution manager 520, an event manager 525, and a high resolution manager 530. The communications manager 515 may be an example of aspects of the communications manager 710 or 810 as described herein.

The low resolution manager 520 may select a first resolution for a first analog-to-digital or digital-to-analog conversion process associated with a first wireless communication. The event manager 525 may determine that the first wireless communication is performed according to the first resolution. The high resolution manager 530 may select, based on the determining, a second resolution for a second analog-to-digital or digital-to-analog conversion process associated with a second wireless communication, the first resolution being a lower resolution than the second resolution.

Transmitter 535 may transmit signals generated by other components of the device 505. In some examples, the transmitter 535 may be collocated with a receiver 510 in a transceiver module. For example, the transmitter 535 may be an example of aspects of the transceiver 720 or 820 as described with reference to FIGS. 7 and 8. The transmitter 535 may utilize a single antenna or a set of antennas.

Figure 6:
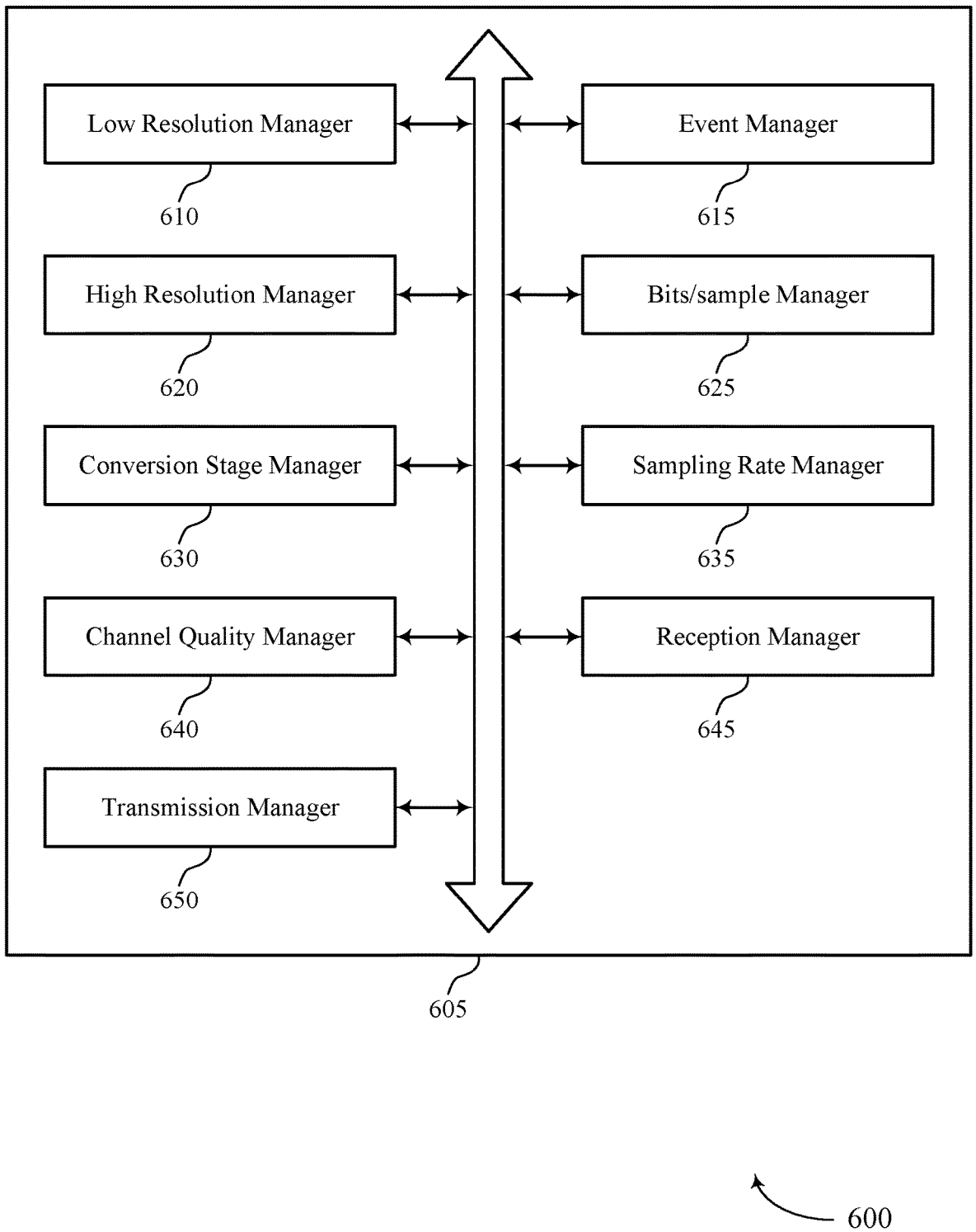
FIG. 6 shows a block diagram of a communications manager that supports use of low resolution ADC/DAC in accordance with aspects of the present disclosure.

FIG. 6 shows a block diagram 600 of a communications manager 605 that supports use of low resolution ADC/DAC in accordance with aspects of the present disclosure. The communications manager 605 may be an example of aspects of a communications manager 415, a communications manager 515, or a communications manager 710 described herein. The communications manager 605 may include a low resolution manager 610, an event manager 615, a high resolution manager 620, a bits/sample manager 625, a conversion stage manager 630, a sampling rate manager 635, a channel quality manager 640, a reception manager 645, and a transmission manager 650. Each of these modules may communicate, directly or indirectly, with one another (e.g., via one or more buses).

The low resolution manager 610 may select a first resolution for a first analog-to-digital or digital-to-analog conversion process associated with a first wireless communication. In some cases, the first wireless communication includes at least one of a PSS, a SSS, a PBCH signal, a system information signal, a RACH signal, a RACH message, a paging signal, a control channel signal, a data channel signal, a wake up signal, a CSI-RS, a TRS, or a combination thereof. In some cases, the RACH message includes at least one of a RAR message, a first uplink message following the RAR message, a contention resolution message, or a combination thereof.

The event manager 615 may determine that the first wireless communication is performed according to the first resolution. In some cases, the wireless device includes at least one of a base station or a UE.

The high resolution manager 620 may select, based on the determining, a second resolution for a second analog-to-digital or digital-to-analog conversion process associated with a second wireless communication, the first resolution being a lower resolution than the second resolution. In some cases, the second wireless communication includes at least one of a SSS, a PBCH signal, a system information signal, a RACH signal, a RACH message, a paging signal, a control channel signal, a data channel signal, or a combination thereof. In some cases, the RACH message includes at least one of a RAR message, a first uplink message following the RAR message, a contention resolution message, or a combination thereof.

The bits/sample manager 625 may select a first number of bits per sample for the first analog-to-digital or digital-to-analog conversion process and a second number of bits per sample for the second analog-to-digital or digital-to-analog conversion process, the second number of bits being greater than the first number of bits.

The conversion stage manager 630 may select a first number of conversion stages for the first analog-to-digital or digital-to-analog conversion process and a second number of conversion stages for the second analog-to-digital or digital-to-analog conversion process, the second number of conversion stages being greater than the first number of conversion stages.

The sampling rate manager 635 may select a first sampling rate for the first analog-to-digital or digital-to-analog conversion process and a second sampling rate for the second analog-to-digital or digital-to-analog conversion process, the second sampling rate being greater than the first sampling rate.

The channel quality manager 640 may determine that a channel quality has crossed a threshold, where the first resolution is selected for the first analog-to-digital or digital-to-analog conversion process based on the channel quality crossing the threshold. In some examples, the channel quality manager 640 may transmit, based on the channel quality crossing the threshold, a signal indicating that the first wireless communication is performed according to the first resolution. In some examples, the channel quality manager 640 may receive a signal indicating that the first wireless communication is performed according to the first resolution.

In some cases, the signal includes at least one of a system information signal, a MAC CE signal, a RRC signal, a DCI signal, a handover command signal, or a combination thereof. In some cases, the channel quality includes at least one of a SNR, a SINR, a RSRP, a RSRQ, or a combination thereof.

The reception manager 645 may receive the first wireless communication. In some examples, the reception manager 645 may perform a first analog-to-digital conversion process on the first wireless communication using the first resolution. In some examples, the reception manager 645 may receive the second wireless communication. In some examples, the reception manager 645 may perform a second analog-to-digital conversion process on the second wireless communication using the second resolution.

The transmission manager 650 may perform a first digital-to-analog conversion process on the first wireless communication using the first resolution. In some examples, the transmission manager 650 may transmit the first wireless communication. In some examples, the transmission manager 650 may perform a second digital-to-analog conversion process on the second wireless communication using the second resolution. In some examples, the transmission manager 650 may transmit the second wireless communication.

Figure 7:
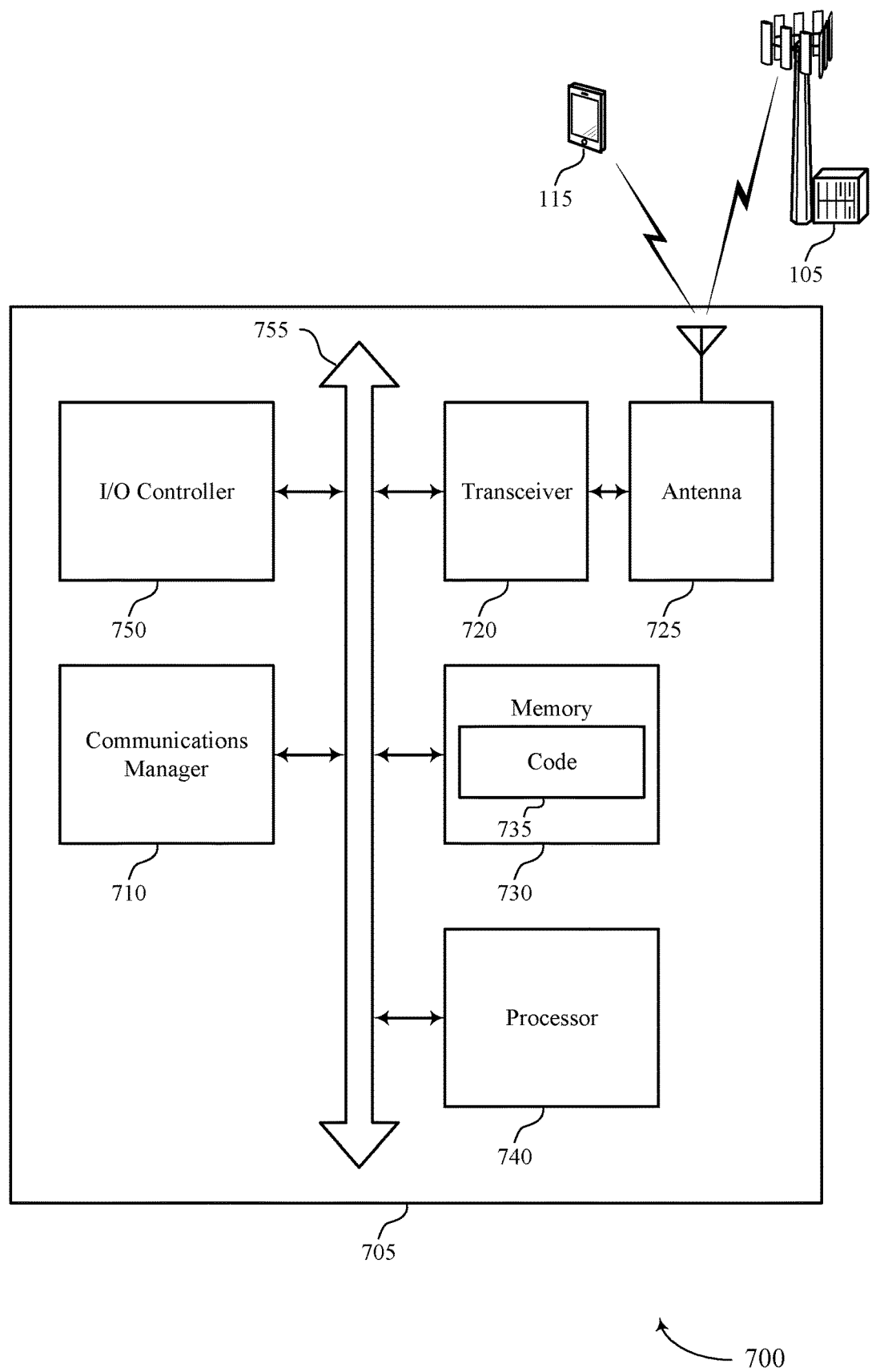
FIG. 7 shows a diagram of a system including a user equipment (UE) that supports use of low resolution ADC/DAC in accordance with aspects of the present disclosure.

FIG. 7 shows a diagram of a system 700 including a device 705 that supports use of low resolution ADC/DAC in accordance with aspects of the present disclosure. The device 705 may be an example of or include the components of device 405, device 505, or a UE 115 as described herein. The device 705 may include components for bi-directional voice and data communications including components for transmitting and receiving communications, including a communications manager 710, a transceiver 720, an antenna 725, memory 730, a processor 740, and an I/O controller 750. These components may be in electronic communication via one or more buses (e.g., bus 755).

The communications manager 710 may select a first resolution for a first analog-to-digital or digital-to-analog conversion process associated with a first wireless communication, determine that the first wireless communication is performed according to the first resolution, and select, based on the determining, a second resolution for a second analog-to-digital or digital-to-analog conversion process associated with a second wireless communication, the first resolution being a lower resolution than the second resolution.

Transceiver 720 may communicate bi-directionally, via one or more antennas, wired, or wireless links as described above. For example, the transceiver 720 may represent a wireless transceiver and may communicate bi-directionally with another wireless transceiver. The transceiver 720 may also include a modem to modulate the packets and provide the modulated packets to the antennas for transmission, and to demodulate packets received from the antennas.

In some cases, the wireless device may include a single antenna 725. However, in some cases the device may have more than one antenna 725, which may be capable of concurrently transmitting or receiving multiple wireless transmissions.

The memory 730 may include random access memory (RAM), read only memory (ROM), or a combination thereof. The memory 730 may store computer-readable code 735 including instructions that, when executed by a processor (e.g., the processor 740) cause the device to perform various functions described herein. In some cases, the memory 730 may contain, among other things, a basic input/output system (BIOS) which may control basic hardware or software operation such as the interaction with peripheral components or devices.

The processor 740 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 740 may be configured to operate a memory array using a memory controller. In other cases, a memory controller may be integrated into the processor 740. The processor 740 may be configured to execute computer-readable instructions stored in a memory (e.g., the memory 730) to cause the device 705 to perform various functions (e.g., functions or tasks supporting use of low resolution ADC/DAC).

The I/O controller 750 may manage input and output signals for the device 705. The I/O controller 750 may also manage peripherals not integrated into the device 705. In some cases, the I/O controller 750 may represent a physical connection or port to an external peripheral. In some cases, the I/O controller 750 may utilize an operating system such as iOS®, ANDROID®, MS-DOS®, MS-WINDOWS®, OS/2®, UNIX®, LINUX®, or another known operating system. In other cases, the I/O controller 750 may represent or interact with a modem, a keyboard, a mouse, a touchscreen, or a similar device. In some cases, the I/O controller 750 may be implemented as part of a processor. In some cases, a user may interact with the device 705 via the I/O controller 750 or via hardware components controlled by the I/O controller 750.

The code 735 may include instructions to implement aspects of the present disclosure, including instructions to support wireless communications. The code 735 may be stored in a non-transitory computer-readable medium such as system memory or other type of memory. In some cases, the code 735 may not be directly executable by the processor 740 but may cause a computer (e.g., when compiled and executed) to perform functions described herein.

Figure 8:
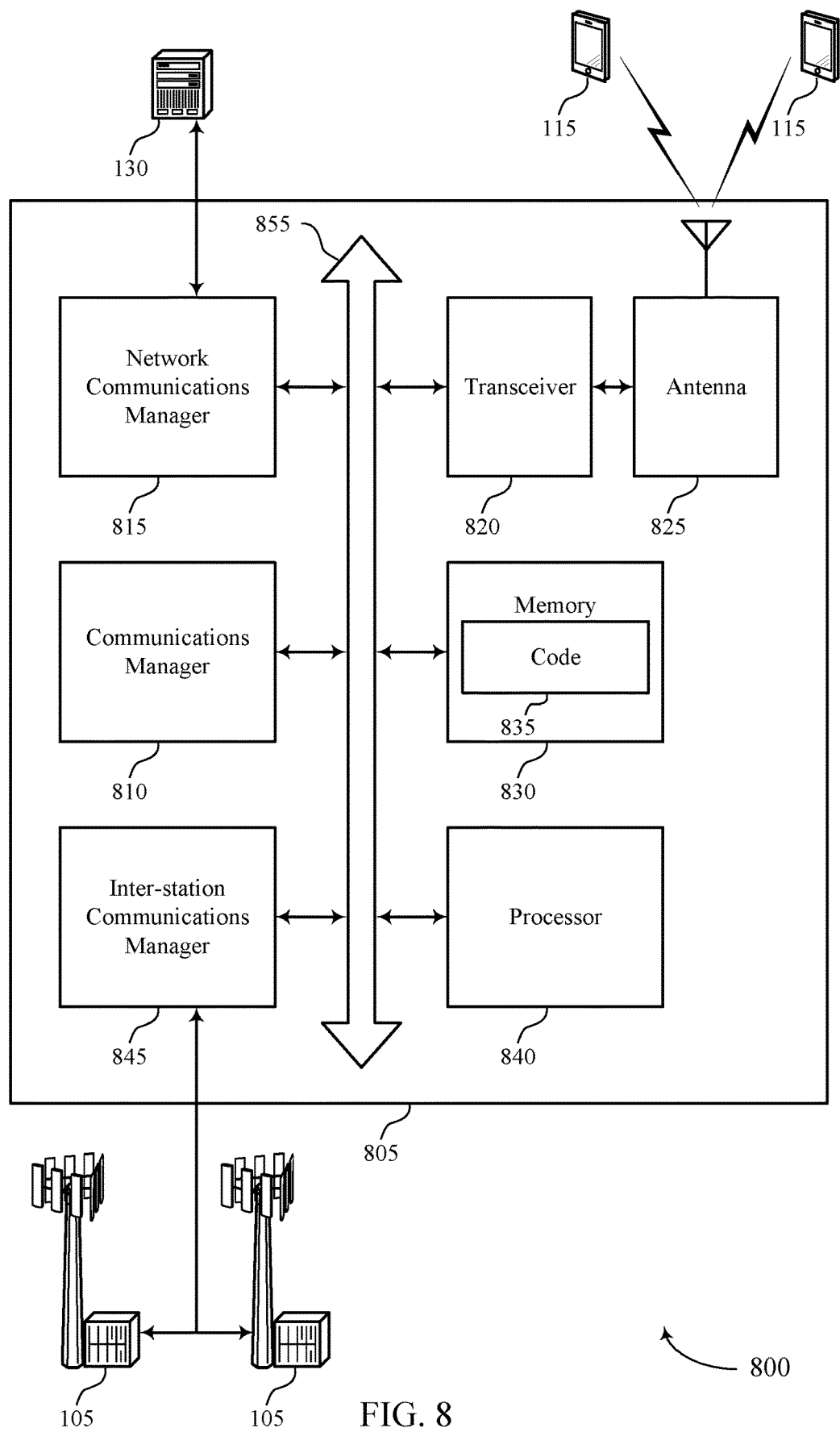
FIG. 8 shows a diagram of a system including a base station that supports use of low resolution ADC/DAC in accordance with aspects of the present disclosure.

FIG. 8 shows a diagram of a system 800 including a device 805 that supports use of low resolution ADC/DAC in accordance with aspects of the present disclosure. The device 805 may be an example of or include the components of device 405, device 505, or a base station 105 as described herein. The device 805 may include components for bi-directional voice and data communications including components for transmitting and receiving communications, including a communications manager 810, a network communications manager 815, a transceiver 820, an antenna 825, memory 830, a processor 840, and an inter-station communications manager 845. These components may be in electronic communication via one or more buses (e.g., bus 855).

The communications manager 810 may select a first resolution for a first analog-to-digital or digital-to-analog conversion process associated with a first wireless communication, determine that the first wireless communication is performed according to the first resolution, and select, based on the determining, a second resolution for a second analog-to-digital or digital-to-analog conversion process associated with a second wireless communication, the first resolution being a lower resolution than the second resolution.

Network communications manager 815 may manage communications with the core network (e.g., via one or more wired backhaul links). For example, the network communications manager 815 may manage the transfer of data communications for client devices, such as one or more UEs 115.

Transceiver 820 may communicate bi-directionally, via one or more antennas, wired, or wireless links as described above. For example, the transceiver 820 may represent a wireless transceiver and may communicate bi-directionally with another wireless transceiver. The transceiver 820 may also include a modem to modulate the packets and provide the modulated packets to the antennas for transmission, and to demodulate packets received from the antennas.

In some cases, the wireless device may include a single antenna 825. However, in some cases the device may have more than one antenna 825, which may be capable of concurrently transmitting or receiving multiple wireless transmissions.

The memory 830 may include RAM, ROM, or a combination thereof. The memory 830 may store computer-readable code 835 including instructions that, when executed by a processor (e.g., the processor 840) cause the device to perform various functions described herein. In some cases, the memory 830 may contain, among other things, a BIOS which may control basic hardware or software operation such as the interaction with peripheral components or devices.

The processor 840 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In other cases, a memory controller may be integrated into the processor 840. The processor 840 may be configured to execute computer-readable instructions stored in a memory (e.g., the memory 830) to cause the device 805 to perform various functions (e.g., functions or tasks supporting use of low resolution ADC/DAC).

Inter-station communications manager 845 may manage communications with other base station 105, and may include a controller or scheduler for controlling communications with UEs 115 in cooperation with other base stations 105. For example, the inter-station communications manager 845 may coordinate scheduling for transmissions to UEs 115 for various interference mitigation techniques such as beamforming or joint transmission. In some examples, inter-station communications manager 845 may provide an X2 interface within an LTE/LTE-A wireless communication network technology to provide communication between base stations 105.

The code 835 may include instructions to implement aspects of the present disclosure, including instructions to support wireless communications. The code 835 may be stored in a non-transitory computer-readable medium such as system memory or other type of memory. In some cases, the code 835 may not be directly executable by the processor 840 but may cause a computer (e.g., when compiled and executed) to perform functions described herein.

Figure 9:
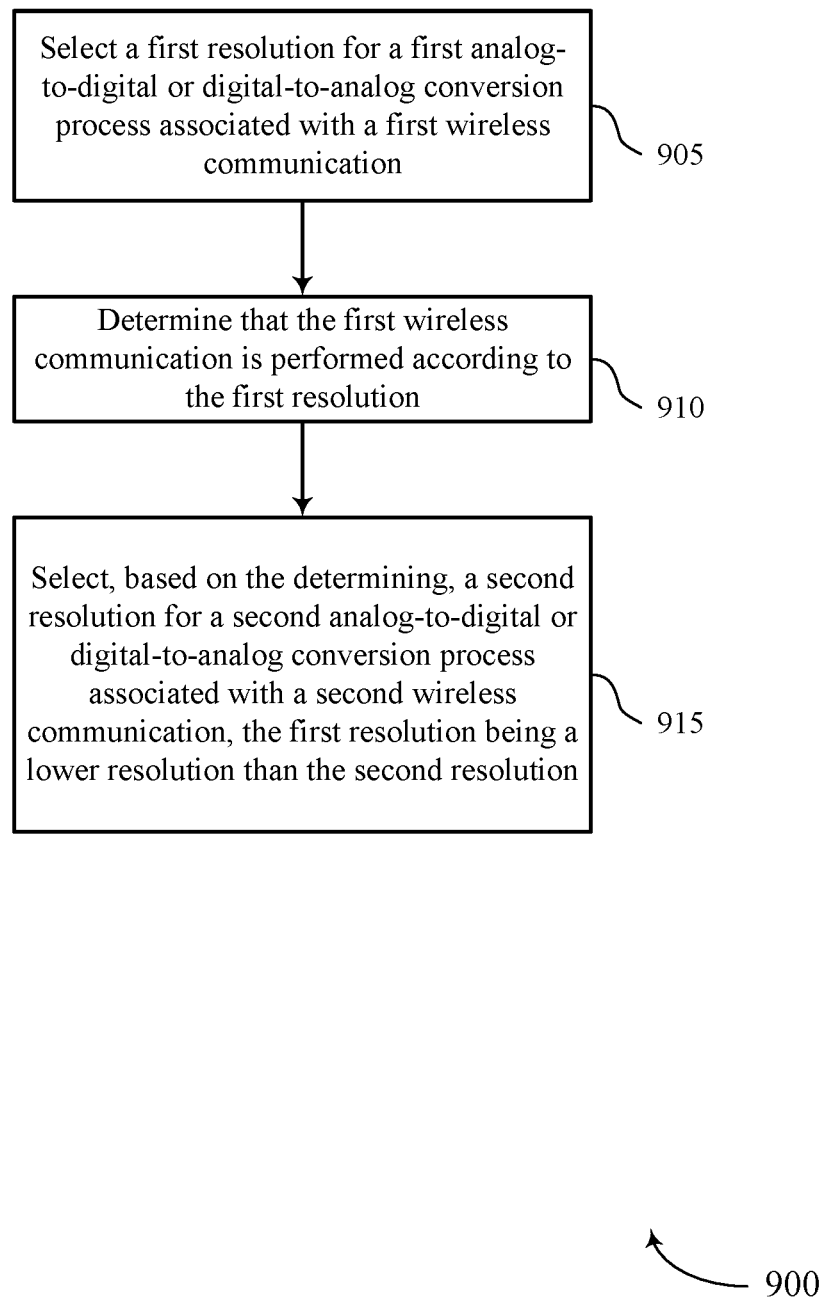
FIGS. 9 through 11 show flowcharts illustrating methods that support use of low resolution ADC/DAC in accordance with aspects of the present disclosure.

FIG. 9 shows a flowchart illustrating a method 900 that supports use of low resolution ADC/DAC in accordance with aspects of the present disclosure. The operations of method 900 may be implemented by a UE 115 or base station 105 or its components as described herein. For example, the operations of method 900 may be performed by a communications manager as described with reference to FIGS. 4 through 8. In some examples, a UE or base station may execute a set of instructions to control the functional elements of the UE or base station to perform the functions described below. Additionally or alternatively, a UE or base station may perform aspects of the functions described below using special-purpose hardware.

At 905, the UE or base station may select a first resolution for a first analog-to-digital or digital-to-analog conversion process associated with a first wireless communication. The operations of 905 may be performed according to the methods described herein. In some examples, aspects of the operations of 905 may be performed by a low resolution manager as described with reference to FIGS. 4 through 8.

At 910, the UE or base station may determine that the first wireless communication is performed according to the first resolution. The operations of 910 may be performed according to the methods described herein. In some examples, aspects of the operations of 910 may be performed by an event manager as described with reference to FIGS. 4 through 8.

At 915, the UE or base station may select, based on the determining, a second resolution for a second analog-to-digital or digital-to-analog conversion process associated with a second wireless communication, the first resolution being a lower resolution than the second resolution. The operations of 915 may be performed according to the methods described herein. In some examples, aspects of the operations of 915 may be performed by a high resolution manager as described with reference to FIGS. 4 through 8.

Figure 10:
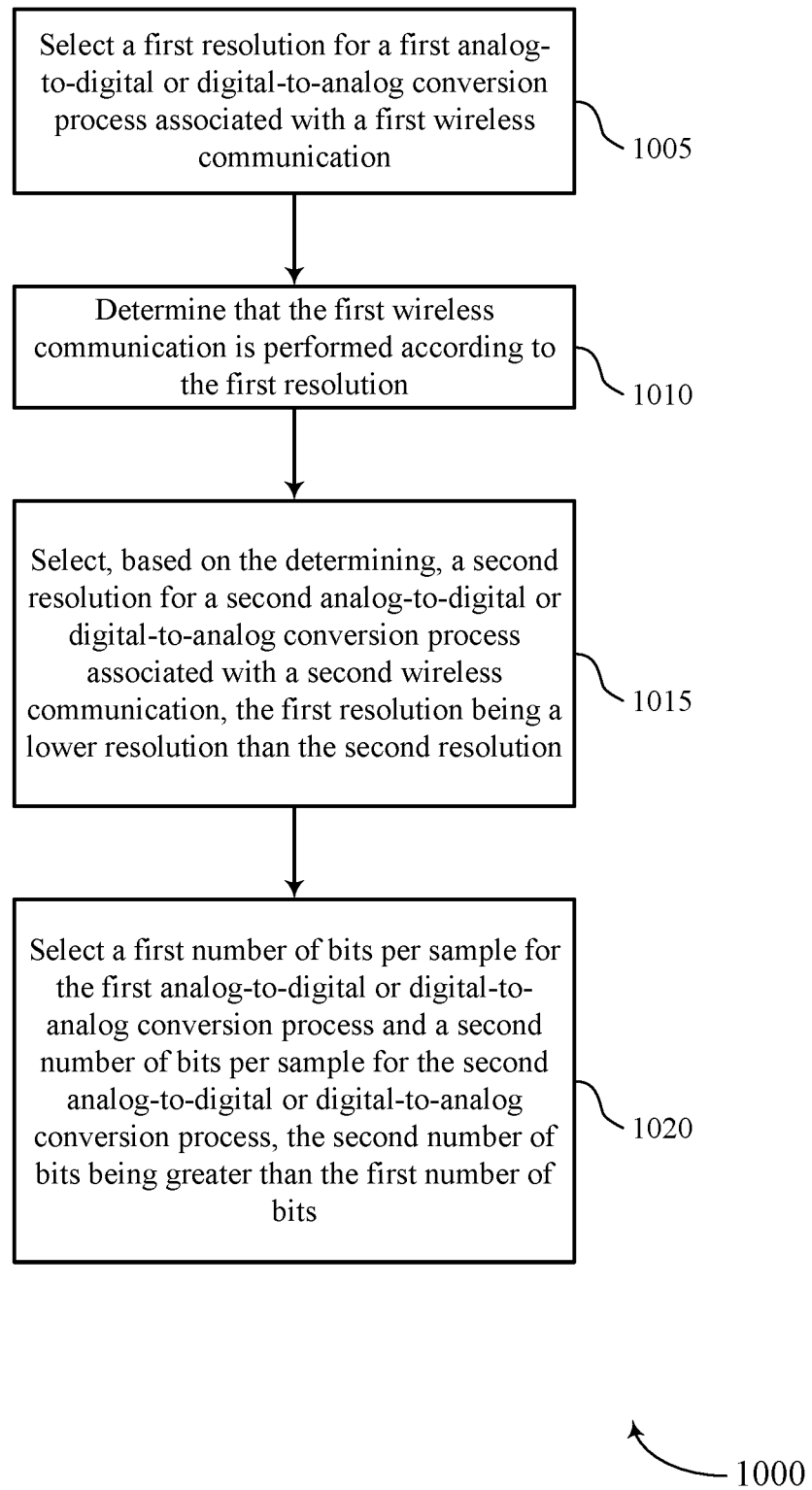

FIG. 10 shows a flowchart illustrating a method 1000 that supports use of low resolution ADC/DAC in accordance with aspects of the present disclosure. The operations of method 1000 may be implemented by a UE 115 or base station 105 or its components as described herein. For example, the operations of method 1000 may be performed by a communications manager as described with reference to FIGS. 4 through 8. In some examples, a UE or base station may execute a set of instructions to control the functional elements of the UE or base station to perform the functions described below. Additionally or alternatively, a UE or base station may perform aspects of the functions described below using special-purpose hardware.

At 1005, the UE or base station may select a first resolution for a first analog-to-digital or digital-to-analog conversion process associated with a first wireless communication. The operations of 1005 may be performed according to the methods described herein. In some examples, aspects of the operations of 1005 may be performed by a low resolution manager as described with reference to FIGS. 4 through 8.

At 1010, the UE or base station may determine that the first wireless communication is performed according to the first resolution. The operations of 1010 may be performed according to the methods described herein. In some examples, aspects of the operations of 1010 may be performed by an event manager as described with reference to FIGS. 4 through 8.

At 1015, the UE or base station may select, based on the determining, a second resolution for a second analog-to-digital or digital-to-analog conversion process associated with a second wireless communication, the first resolution being a lower resolution than the second resolution. The operations of 1015 may be performed according to the methods described herein. In some examples, aspects of the operations of 1015 may be performed by a high resolution manager as described with reference to FIGS. 4 through 8.

At 1020, the UE or base station may select a first number of bits per sample for the first analog-to-digital or digital-to-analog conversion process and a second number of bits per sample for the second analog-to-digital or digital-to-analog conversion process, the second number of bits being greater than the first number of bits. The operations of 1020 may be performed according to the methods described herein. In some examples, aspects of the operations of 1020 may be performed by a bits/sample manager as described with reference to FIGS. 4 through 8.

Figure 11:
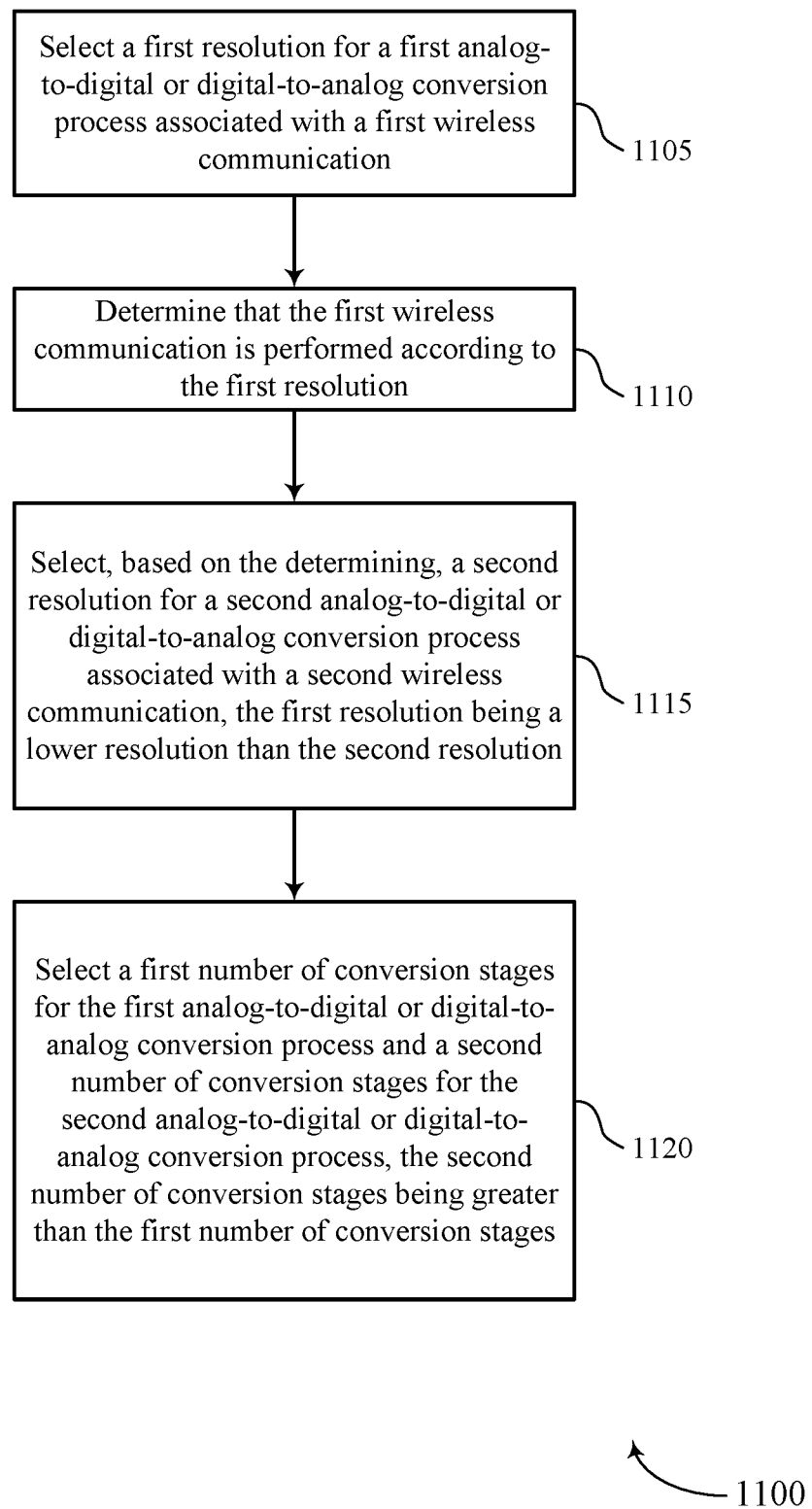

FIG. 11 shows a flowchart illustrating a method 1100 that supports use of low resolution ADC/DAC in accordance with aspects of the present disclosure. The operations of method 1100 may be implemented by a UE 115 or base station 105 or its components as described herein. For example, the operations of method 1100 may be performed by a communications manager as described with reference to FIGS. 4 through 8. In some examples, a UE or base station may execute a set of instructions to control the functional elements of the UE or base station to perform the functions described below. Additionally or alternatively, a UE or base station may perform aspects of the functions described below using special-purpose hardware.

At 1105, the UE or base station may select a first resolution for a first analog-to-digital or digital-to-analog conversion process associated with a first wireless communication. The operations of 1105 may be performed according to the methods described herein. In some examples, aspects of the operations of 1105 may be performed by a low resolution manager as described with reference to FIGS. 4 through 8.

At 1110, the UE or base station may determine that the first wireless communication is performed according to the first resolution. The operations of 1110 may be performed according to the methods described herein. In some examples, aspects of the operations of 1110 may be performed by an event manager as described with reference to FIGS. 4 through 8.

At 1115, the UE or base station may select, based on the determining, a second resolution for a second analog-to-digital or digital-to-analog conversion process associated with a second wireless communication, the first resolution being a lower resolution than the second resolution. The operations of 1115 may be performed according to the methods described herein. In some examples, aspects of the operations of 1115 may be performed by a high resolution manager as described with reference to FIGS. 4 through 8.

At 1120, the UE or base station may select a first number of conversion stages for the first analog-to-digital or digital-to-analog conversion process and a second number of conversion stages for the second analog-to-digital or digital-to-analog conversion process, the second number of conversion stages being greater than the first number of conversion stages. The operations of 1120 may be performed according to the methods described herein. In some examples, aspects of the operations of 1120 may be performed by a conversion stage manager as described with reference to FIGS. 4 through 8.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communications at a wireless device, comprising:
   selecting a first resolution for a first analog-to-digital or digital-to-analog conversion process associated with a first wireless communication;
   determining that the first wireless communication is performed according to the first resolution; and
   selecting, based at least in part on the determining, a second resolution for a second analog-to-digital or digital-to-analog conversion process associated with a second wireless communication, the first resolution being a lower resolution than the second resolution.

2. The method of claim 1, further comprising:
   selecting a first number of bits per sample for the first analog-to-digital or digital-to-analog conversion process and a second number of bits per sample for the second analog-to-digital or digital-to-analog conversion process, the second number of bits being greater than the first number of bits.

3. The method of claim 1, further comprising:
   selecting a first number of conversion stages for the first analog-to-digital or digital-to-analog conversion process and a second number of conversion stages for the second analog-to-digital or digital-to-analog conversion process, the second number of conversion stages being greater than the first number of conversion stages.

4. The method of claim 1, further comprising:
   selecting a first sampling rate for the first analog-to-digital or digital-to-analog conversion process and a second sampling rate for the second analog-to-digital or digital-to-analog conversion process, the second sampling rate being greater than the first sampling rate.

5. The method of claim 1, further comprising:
   determining that a channel quality has crossed a threshold, wherein the first resolution is selected for the first analog-to-digital or digital-to-analog conversion process based at least in part on the channel quality crossing the threshold.

6. The method of claim 5, further comprising:
   transmitting, based at least in part on the channel quality crossing the threshold, a signal indicating that the first wireless communication is performed according to the first resolution.

7. The method of claim 6, wherein the signal comprises at least one of a system information signal, a medium access control (MAC) control element (CE) signal, a radio resource control (RRC) signal, a downlink control information (DCI) signal, a handover command signal, or a combination thereof.

8. The method of claim 5, wherein the channel quality comprises at least one of a signal-to-noise ratio (SNR), a signal-to-interference-to-noise ratio (SINR), a reference signal received power (RSRP), a reference signal received quality (RSRQ), or a combination thereof.

9. The method of claim 1, further comprising:
   receiving a signal indicating that the first wireless communication is performed according to the first resolution.

10. The method of claim 1, further comprising:
    receiving the first wireless communication;
    performing a first analog-to-digital conversion process on the first wireless communication using the first resolution;
    receiving the second wireless communication; and
    performing a second analog-to-digital conversion process on the second wireless communication using the second resolution.

11. The method of claim 1, further comprising:
    performing a first digital-to-analog conversion process on the first wireless communication using the first resolution;
    transmitting the first wireless communication;
    performing a second digital-to-analog conversion process on the second wireless communication using the second resolution; and
    transmitting the second wireless communication.

12. The method of claim 1, wherein the first wireless communication comprises at least one of a primary synchronization signal (PSS), a secondary synchronization signal (SSS), a physical broadcast channel (PBCH) signal, a system information signal, a random access channel (RACH) signal, a RACH message, a paging signal, a control channel signal, a data channel signal, a wake up signal, a channel state interference reference signal (CSI-RS), a tracking reference signal (TRS), or a combination thereof.

13. The method of claim 12, wherein the RACH message comprises at least one of a random access response (RAR) message, a first uplink message following the RAR message, a contention resolution message, or a combination thereof.

14. The method of claim 1, wherein the second wireless communication comprises at least one of a secondary synchronization signal (SSS), a physical broadcast channel (PBCH) signal, a system information signal, a random access channel (RACH) signal, a RACH message, a paging signal, a control channel signal, a data channel signal, or a combination thereof.

15. The method of claim 14, wherein the RACH message comprises at least one of a random access response (RAR) message, a first uplink message following the RAR message, a contention resolution message, or a combination thereof.

16. The method of claim 1, wherein the wireless device comprises at least one of a base station or a user equipment (UE).

17. An apparatus for wireless communications at a wireless device, comprising:
a processor,
memory in electronic communication with the processor; and
instructions stored in the memory and executable by the processor to cause the apparatus to:
select a first resolution for a first analog-to-digital or digital-to-analog conversion process associated with a first wireless communication;
determine that the first wireless communication is performed according to the first resolution; and
select, based at least in part on the determining, a second resolution for a second analog-to-digital or digital-to-analog conversion process associated with a second wireless communication, the first resolution being a lower resolution than the second resolution.

18. The apparatus of claim 17, wherein the instructions are further executable by the processor to cause the apparatus to:
select a first number of bits per sample for the first analog-to-digital or digital-to-analog conversion process and a second number of bits per sample for the second analog-to-digital or digital-to-analog conversion process, the second number of bits being greater than the first number of bits.

19. The apparatus of claim 17, wherein the instructions are further executable by the processor to cause the apparatus to:
select a first number of conversion stages for the first analog-to-digital or digital-to-analog conversion process and a second number of conversion stages for the second analog-to-digital or digital-to-analog conversion process, the second number of conversion stages being greater than the first number of conversion stages.

20. The apparatus of claim 17, wherein the instructions are further executable by the processor to cause the apparatus to:
select a first sampling rate for the first analog-to-digital or digital-to-analog conversion process and a second sampling rate for the second analog-to-digital or digital-to-analog conversion process, the second sampling rate being greater than the first sampling rate.

21. The apparatus of claim 17, wherein the instructions are further executable by the processor to cause the apparatus to:
determine that a channel quality has crossed a threshold, wherein the first resolution is selected for the first analog-to-digital or digital-to-analog conversion process based at least in part on the channel quality crossing the threshold.

22. The apparatus of claim 21, wherein the instructions are further executable by the processor to cause the apparatus to:
transmit, based at least in part on the channel quality crossing the threshold, a signal indicating that the first wireless communication is performed according to the first resolution.

23. The apparatus of claim 22, wherein the signal comprises at least one of a system information signal, a medium access control (MAC) control element (CE) signal, a radio resource control (RRC) signal, a downlink control information (DCI) signal, a handover command signal, or a combination thereof.

24. The apparatus of claim 21, wherein the channel quality comprises at least one of a signal-to-noise ratio (SNR), a signal-to-interference-to-noise ratio (SINR), a reference signal received power (RSRP), a reference signal received quality (RSRQ), or a combination thereof.

25. The apparatus of claim 17, wherein the instructions are further executable by the processor to cause the apparatus to:
receive a signal indicating that the first wireless communication is performed according to the first resolution.

26. The apparatus of claim 17, wherein the instructions are further executable by the processor to cause the apparatus to:
receive the first wireless communication;
perform a first analog-to-digital conversion process on the first wireless communication using the first resolution;
receive the second wireless communication; and
perform a second analog-to-digital conversion process on the second wireless communication using the second resolution.

27. The apparatus of claim 17, wherein the instructions are further executable by the processor to cause the apparatus to:
perform a first digital-to-analog conversion process on the first wireless communication using the first resolution;
transmit the first wireless communication;
perform a second digital-to-analog conversion process on the second wireless communication using the second resolution; and
transmit the second wireless communication.

28. The apparatus of claim 17, wherein the first wireless communication comprises at least one of a primary synchronization signal (PSS), a secondary synchronization signal (SSS), a physical broadcast channel (PBCH) signal, a system information signal, a random access channel (RACH) signal, a RACH message, a paging signal, a control channel signal, a data channel signal, a wake up signal, a channel state interference reference signal (CSI-RS), a tracking reference signal (TRS), or a combination thereof.

29. An apparatus for wireless communications at a wireless device, comprising:
means for selecting a first resolution for a first analog-to-digital or digital-to-analog conversion process associated with a first wireless communication;

means for determining that the first wireless communication is performed according to the first resolution; and means for selecting, based at least in part on the determining, a second resolution for a second analog-to-digital or digital-to-analog conversion process associated with a second wireless communication, the first resolution being a lower resolution than the second resolution.

30. A non-transitory computer-readable medium storing code for wireless communications at a wireless device, the code comprising instructions executable by a processor to:

select a first resolution for a first analog-to-digital or digital-to-analog conversion process associated with a first wireless communication;

determine that the first wireless communication is performed according to the first resolution; and select, based at least in part on the determining, a second resolution for a second analog-to-digital or digital-to-analog conversion process associated with a second wireless communication, the first resolution being a lower resolution than the second resolution.

* * * * *